United States Patent
Wendell

(10) Patent No.: US 9,627,038 B2
(45) Date of Patent: Apr. 18, 2017

(54) MULTIPORT MEMORY CELL HAVING IMPROVED DENSITY AREA

(71) Applicant: Intel Corporation, Santa Clara, CA (US)

(72) Inventor: Dennis Wendell, Boulder Creek, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/216,855

(22) Filed: Mar. 17, 2014

(65) Prior Publication Data
US 2015/0023086 A1    Jan. 22, 2015

Related U.S. Application Data

(60) Provisional application No. 61/800,885, filed on Mar. 15, 2013.

(51) Int. Cl.
*G11C 7/00* (2006.01)
*G11C 7/12* (2006.01)
(Continued)

(52) U.S. Cl.
CPC .............. *G11C 11/419* (2013.01); *G11C 5/06* (2013.01); *G11C 8/16* (2013.01); *G11C 11/412* (2013.01);
(Continued)

(58) Field of Classification Search
CPC ....... G11C 8/16; G11C 7/1075; G11C 11/413; G11C 11/409
(Continued)

(56) References Cited

U.S. PATENT DOCUMENTS

| | | |
|---|---|---|
| 5,053,952 A | 10/1991 | Koopman, Jr. et al. |
| 5,386,583 A | 1/1995 | Hendricks |

(Continued)

FOREIGN PATENT DOCUMENTS

| | | |
|---|---|---|
| EP | 0638183 | 3/1997 |
| TW | 200719216 | 5/2007 |

(Continued)

OTHER PUBLICATIONS

Zhou Li, Fast Interconnect Synthesis With Layer Assignment. Apr. 2008.
(Continued)

*Primary Examiner* — Ly D Pham
(74) *Attorney, Agent, or Firm* — Nicholson, De Vos, Webster & Elliot, LLP

(57) ABSTRACT

A mutltiport memory cell having improved density area is disclosed. The memory cell includes a data storing component, a first memory access component coupled to a first side of the data storing component, a second memory access component coupled to a second side of the data storing component, first and second bit lines coupled to the first memory access component, first and second bit lines coupled to the second memory access component, first and second write lines coupled to the first memory access component and first and second write lines coupled to the second memory access component. The multiport memory cell also includes a read/write assist transistor, coupled to load transistors of the data storing component, that during read operations is activated for the duration of the read operation and during write operations is activated to impress the desired voltage level before or after one or more memory access components activated as a part of the write operation are deactivated.

23 Claims, 8 Drawing Sheets

(51) Int. Cl.

| | | |
|---|---|---|
| *G11C 11/4074* | (2006.01) | |
| *G11C 8/16* | (2006.01) | |
| *G11C 5/14* | (2006.01) | |
| *G11C 11/419* | (2006.01) | |
| *G11C 5/06* | (2006.01) | |
| *G11C 11/412* | (2006.01) | |
| G11C 7/10 | (2006.01) | |
| G11C 11/413 | (2006.01) | |
| G11C 11/409 | (2006.01) | |

(52) U.S. Cl.
CPC .............. *G11C 7/00* (2013.01); *G11C 7/1075* (2013.01); *G11C 7/12* (2013.01); *G11C 11/409* (2013.01); *G11C 11/413* (2013.01)

(58) Field of Classification Search
USPC .............. 365/154, 155, 156, 230.05, 189.14, 365/189.11
See application file for complete search history.

(56) References Cited

U.S. PATENT DOCUMENTS

| | | | |
|---|---|---|---|
| 5,651,124 A | 7/1997 | Shen et al. | |
| 5,729,766 A | 3/1998 | Cohen | |
| 5,751,982 A | 5/1998 | Morley | |
| 5,784,638 A | 7/1998 | Goetz et al. | |
| 5,826,055 A | 10/1998 | Wang et al. | |
| 5,826,073 A | 10/1998 | Ben-Meir et al. | |
| 5,870,575 A | 2/1999 | Kahle et al. | |
| 5,870,584 A | 2/1999 | Bennett | |
| 5,905,876 A | 5/1999 | Pawlowski et al. | |
| 5,983,335 A | 11/1999 | Dwyer, III | |
| 6,049,868 A | 4/2000 | Panwar | |
| 6,052,777 A | 4/2000 | Panwar | |
| 6,061,785 A | 5/2000 | Chiarot et al. | |
| 6,269,439 B1 | 7/2001 | Hanaki | |
| 6,360,311 B1 | 3/2002 | Zandveld et al. | |
| 6,385,676 B1 | 5/2002 | Adkisson | |
| 6,557,095 B1 | 4/2003 | Henstrom | |
| 6,711,672 B1 | 3/2004 | Agesen | |
| 6,779,092 B2 | 8/2004 | Watts | |
| 6,813,704 B1 | 11/2004 | Nguyen | |
| 6,851,011 B2 | 2/2005 | Lin | |
| 6,898,699 B2 | 5/2005 | Jourdan et al. | |
| 7,096,345 B1 | 8/2006 | Chen et al. | |
| 7,113,510 B2 | 9/2006 | Lin | |
| 7,127,592 B2 | 10/2006 | Abraham et al. | |
| 7,170,814 B2 * | 1/2007 | Morikawa ................ | G11C 8/16 365/154 |
| 7,373,637 B2 | 5/2008 | DeWitt, Jr. et al. | |
| 7,434,031 B1 | 10/2008 | Spracklen et al. | |
| 7,644,210 B1 | 1/2010 | Banning et al. | |
| 7,710,763 B2 * | 5/2010 | Houston ...................... | 365/154 |
| 7,716,460 B2 | 5/2010 | Stempel et al. | |
| 7,721,076 B2 | 5/2010 | Sodani et al. | |
| 7,783,869 B2 | 8/2010 | Grandou et al. | |
| 7,813,163 B2 * | 10/2010 | Pille et al. ...................... | 365/154 |
| 8,024,522 B1 | 9/2011 | Favor et al. | |
| 8,074,060 B2 | 12/2011 | Col et al. | |
| 8,219,784 B2 | 7/2012 | Ban et al. | |
| 8,238,192 B2 * | 8/2012 | Nii .......................... | 365/230.05 |
| 8,959,094 B2 | 2/2015 | Taylor | |
| 2002/0032852 A1 | 3/2002 | Ramirez et al. | |
| 2003/0101444 A1 | 5/2003 | Wu et al. | |
| 2003/0163671 A1 | 8/2003 | Gschwind et al. | |
| 2004/0133766 A1 | 7/2004 | Abraham et al. | |
| 2006/0026408 A1 | 2/2006 | Morris et al. | |
| 2006/0242365 A1 | 10/2006 | Ali et al. | |
| 2007/0186081 A1 | 8/2007 | Chaundry et al. | |
| 2007/0192541 A1 | 8/2007 | Balasubramonian et al. | |
| 2008/0028195 A1 | 1/2008 | Kissell et al. | |
| 2008/0126771 A1 | 5/2008 | Chen et al. | |
| 2008/0216073 A1 | 9/2008 | Yates et al. | |
| 2009/0019261 A1 | 1/2009 | Nguyen et al. | |
| 2009/0049279 A1 | 2/2009 | Steiss et al. | |
| 2009/0103377 A1 * | 4/2009 | Chang .................... | G11C 11/412 365/189.09 |
| 2009/0164766 A1 | 6/2009 | Suggs et al. | |
| 2009/0210627 A1 | 8/2009 | Alexander et al. | |
| 2009/0254709 A1 | 10/2009 | Agesen | |
| 2010/0097840 A1 * | 4/2010 | Kim ............................... | 365/145 |
| 2010/0131742 A1 | 5/2010 | Col et al. | |
| 2010/0153690 A1 | 6/2010 | Vick et al. | |
| 2010/0161948 A1 | 6/2010 | Abdallah | |
| 2011/0016292 A1 | 1/2011 | Mcdonald et al. | |
| 2011/0271055 A1 | 11/2011 | O'Connor | |
| 2011/0320784 A1 | 12/2011 | Almog et al. | |
| 2012/0117335 A1 | 5/2012 | Bryant | |
| 2012/0198157 A1 | 8/2012 | Abdallah | |
| 2012/0221747 A1 | 8/2012 | Mei et al. | |
| 2013/0086365 A1 | 4/2013 | Gschwind et al. | |
| 2014/0126278 A1 * | 5/2014 | Nii et al. ................ | G11O 5/063 365/154 |
| 2014/0281116 A1 | 9/2014 | Abdallah | |
| 2014/0281388 A1 | 9/2014 | Abdallah | |
| 2014/0281422 A1 | 9/2014 | Abdallah | |
| 2014/0282546 A1 | 9/2014 | Abdallah | |
| 2014/0282575 A1 | 9/2014 | Chan | |
| 2014/0304492 A1 | 10/2014 | Abdallah | |
| 2015/0324213 A1 | 11/2015 | Abdallah et al. | |

FOREIGN PATENT DOCUMENTS

| | | |
|---|---|---|
| TW | I368165 | 7/2012 |
| TW | I377502 | 11/2012 |
| WO | 9737301 | 10/1997 |

OTHER PUBLICATIONS

Michael Slater, Microprocessor Report, The Insiders' Guide to Microprocessor Hardware, Oct. 1994, vol. 8.

\* cited by examiner

MULTIPORT MEMORY CELL HAVING IMPROVED DENSITY AREA

RELATED APPLICATIONS

This application claims priority to U.S. Provisional Patent Application Ser. No. 61/800,885, filed on Mar. 15, 2013, entitled "Multiport Memory Cell Having Improved Density Area" which is hereby incorporated herein by reference in its entirety.

BACKGROUND

FIG. 1 shows a multiport cell SRAM 150 that has true/complement pairs of wires that form bit line pairs or ports. The multiport cell SRAM 150 includes MNTT (true side pass component), MPLT (true load transistor), MPLC (complement side load transistor), MNDT (true side drive transistor), MNDC (complement side drive transistor), MNTC (complement side pass component), W0 (word line topside), W1 (word line bottom), B0*t* (true side bit line 1), B1T (true side bit line 2), B0C (complement side bit line 1) and B1C (complement side bit line 2). Referring to FIG. 1, transistors MPLT, MPLC, MNDT and MNDC constitute the data holding portion of SRAM memory cell 150. Transistors MNTT and MNTC are pass gates.

Read stability and writeability are parameters that are used to assess the operation of memory cells. SRAM cells are considered stable if they can be read without the read operation causing the state of the data that is stored within them to change. As regards reads, during a read operation, turning on the pass gates, which are controlled by the word lines, results in a beta ratio effect on the low side of the memory cell between MNTT and MNOT. The increasing voltage on node MT turns on MNDC and causes a lowering of the voltage on node MC. A size ratio must be utilized as a part of the design implementation that prevents a feedback to node MT which would be positively reinforcing (causing read instability). Typical ratios of WMNDT/WMNTT=WMNDC/WMNTC of approximately 2 are considered good design practice.

As regards writes, during write operations one of the pair of bit lines is transitioned low (Vss). An internal change of state results from the low bit line pulling the high node toward Vss (current Ids flows through transfer gate MNTC) and is assisted by the MNTT gate pulling MT up toward Vdd. The MNTC MOSFET gate must have sufficient current to pull the high node lower (MPLC is acting like a resistor in the linear region of MOSFET operations). The voltage drop across the MPLC must be high enough to induce unstable feedback to change state. Process statistical variability can result in weak N/strong P conditions which can result in the inability to write. Ratioed memory cells can exhibit difficulty at lowered Vdd supply.

FIG. 2 shows another conventional multiport SRAM memory cell 250. SRAM memory cell 250 includes data storage and pass components similar to those shown in FIG. 1. In addition to components shown in FIG. 1, SRAM memory cell 250 includes separate read transistors that are coupled to separate read word lines Rwl0 and Rwl1 (these word line a separate from write word lines Wwl0 and Wwl1). Transistors MNTT and MNTC are pass gates. SRAM memory cell 250 features separate read and write ports (as part of a so called 8T cell) that improves writeability and provides low Vdd functionality. As regards readability, read operations do not activate transistors that are connected to internal nodes, i.e. only gate connections resulting in minimal read disturbance of internal storage nodes. Typically, for "single ended" reads, true/complement bit lines are not relevant for stability. As regards writeability, writes are improved since transistors can be beta ratioed to favor writes since activation of a write word line implies a state change is intended (contrast to shared port cell).

FIG. 1 shows a multiport cell SRAM 150 that has true/complement pairs of wires that form bit line pairs or ports. The multiport cell SRAM 150 includes MNTT (true side pass component), MPLT (true load transistor), MPLC (complement side load transistor), MNDT (true side drive transistor), MNDC (complement side drive transistor), MNTC (complement side pass component), W0 (word line topside), W1 (word line bottom), B0*t* (true side bit line 1), B1T (true side bit line 2), B0*c* (complement side bit line 1) and B1C (complement side bit line 2). Referring to FIG. 1, transistors MPLT, MPLC, MNDT and MNDC constitute the data holding portion of SRAM memory cell 150. Transistors MNTT and MNTC are pass gates.

Disadvantages of SRAM memory cell 250 is that multiple separate write/read wordline wires are required and separate write/read bit lines (ports) are used. Area usage is high due to large number of wire pitches. Active transistors are also high due to separate active area for read and write transistors.

Increasing the memory cell density of memory cell arrays increases the data storage capacity of memory cell arrays. Many conventional designs feature port intensive memory cell structures. Such structures are implemented using increased numbers of wires/lines (e.g., bit lines and word lines) that increase power consumption and require more area. In addition, some conventional designs utilize more transistors that also require more area.

SUMMARY

Many conventional designs feature port intensive memory cell structures. Such structures are implemented using increased numbers of lines (e.g., bit lines and word lines) that increase power consumption and require more area. In addition, some conventional designs utilize more transistors that also require more area. A mutltiport memory cell having improved density area is disclosed that addresses the aforementioned shortcomings of conventional processor designs. However, the claimed embodiments are not limited to implementations that address any or all of the aforementioned shortcomings. The mutltiport memory cell having improved density area includes a data storing component, a first memory access component coupled to a first side of the data storing component, a second memory access component coupled to a second side of the data storing component, first and second bit lines coupled to the first memory access component, first and second bit lines coupled to the second memory access component, first and second write lines coupled to the first memory access component and first and second write lines coupled to the second memory access component. The multiport memory cell also includes a read/write assist transistor, coupled to load transistors of the data storing component, that during read operations is activated for the duration of the read operation and during write operations is initially deactivated assist with the write operation. Subsequently, during the write operation the read/write assist transistor is activated to impress the desired voltage level before or after one or more memory access components activated as a part of the write operation are deactivated.

BRIEF DESCRIPTION OF THE DRAWINGS

The invention, together with further advantages thereof, may best be understood by reference to the following description taken in conjunction with the accompanying drawings in which.

It should be noted that like reference numbers refer to like elements in the figures.

DETAILED DESCRIPTION

Figure 1:
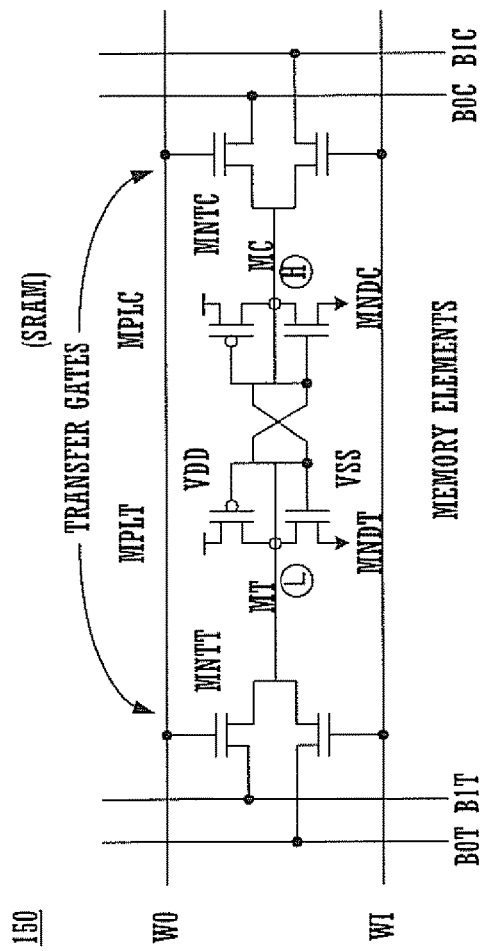
FIG. 1 shows a multiport cell SRAM that has true/complement pairs of wires that form bit line pairs or ports.
Figure 2:
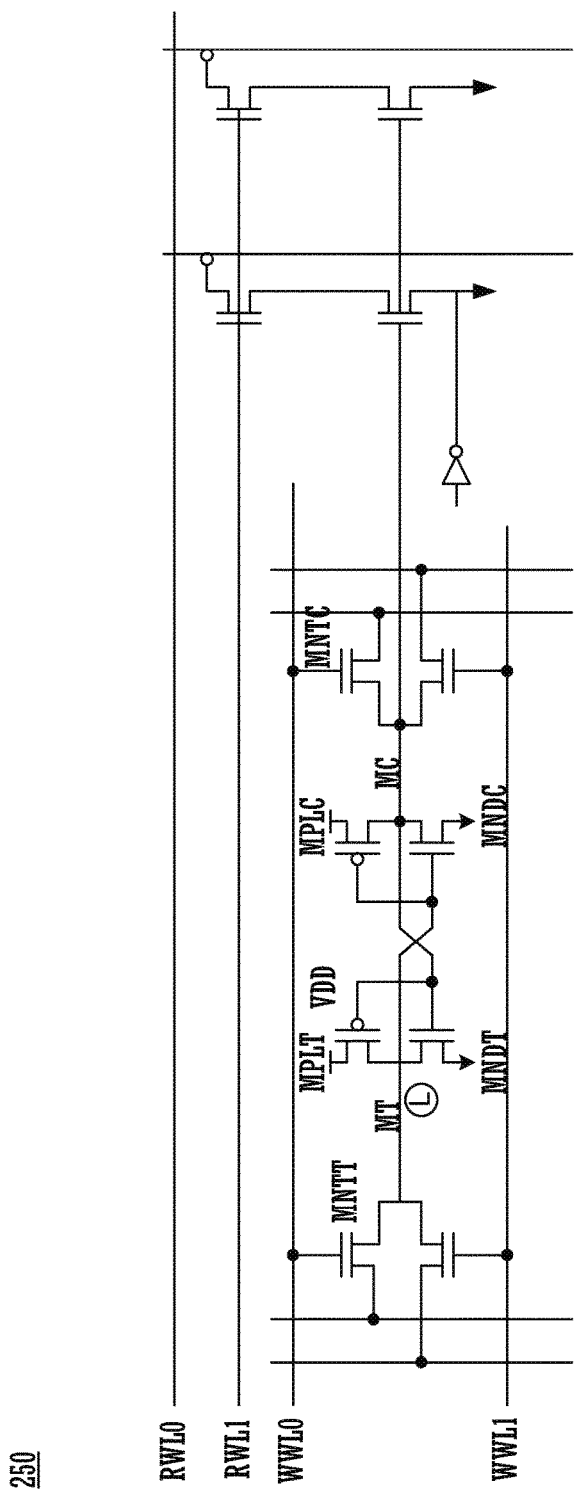
FIG. 2 shows another conventional multiport SRAM memory cell.

Although the present invention has been described in connection with one embodiment, the invention is not intended to be limited to the specific forms set forth herein. On the contrary, it is intended to cover such alternatives, modifications, and equivalents as can be reasonably included within the scope of the invention as defined by the appended claims.

In the following detailed description, numerous specific details such as specific method orders, structures, elements, and connections have been set forth. It is to be understood however that these and other specific details need not be utilized to practice embodiments of the present invention. In other circumstances, well-known structures, elements, or connections have been omitted, or have not been described in particular detail in order to avoid unnecessarily obscuring this description.

References within the specification to "one embodiment" or "an embodiment" are intended to indicate that a particular feature, structure, or characteristic described in connection with the embodiment is included in at least one embodiment of the present invention. The appearance of the phrase "in one embodiment" in various places within the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals of a computer readable storage medium and are capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "receiving" or "biasing" or "determining" or "placing" or the like, refer to the action and processes of a computer system, or similar electronic computing device that manipulates and transforms data represented as physical (electronic) quantities within the computer system's registers and memories and other computer readable media into other data similarly represented as physical quantities within the computer system memories or registers or other such information storage, transmission or display devices.

Figure 3:
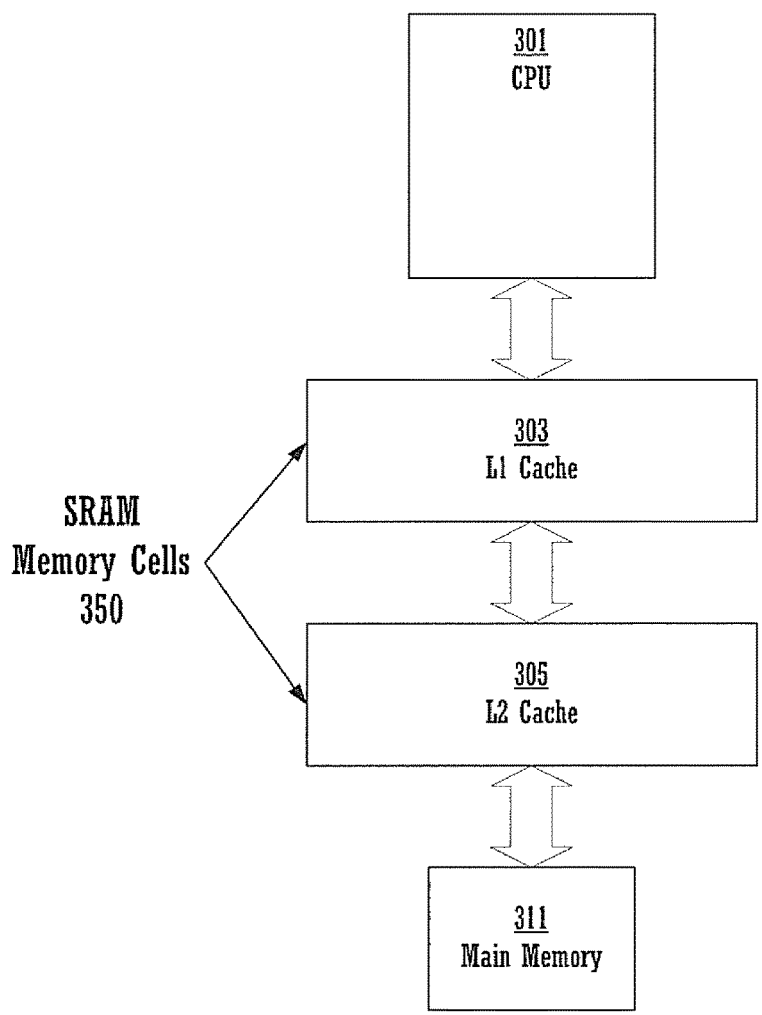
FIG. 3 shows an exemplary operating environment of an SRAM memory cell according to one embodiment.

Exemplary Operating Environment of an SRAM Memory Cell Configured for Density/Area Maximization According to One Embodiment FIG. 3 shows an exemplary operating environment 300 of SRAM memory cell(s) 350 according to one embodiment. SRAM memory cell 350 includes a shared word line multiport cell structure that enables less area usage than some conventional cells that use separate read/write ports and involves a large number of word line pitches. SRAM memory cell 350 features a sizing of transistors and the use of a MOSFET that facilitates read stability and writeability in a memory cell structure that enables less area usage than some conventional memory cells. FIG. 3 shows CPU 301, L1 cache 303, L2 cache 305, SRAM memory cells 350 and main memory 311.

Referring to FIG. 3, CPU executes instructions and carries out accesses of L1 cache 303, L2 cache 305 and main memory 311 that involve storing and loading data and instructions. In one embodiment, L1 cache 303 and L2 cache 305 comprise SRAM memory cells 350. SRAM memory cells 350 are described herein below in detail in conjunction with FIG. 3. In one embodiment, main memory 311 constitutes larger memory than L1 cache 303 and L2 cache 305 and can comprise DRAM memory cells. In other embodiments main memory 311 can comprise other types of memory cells.

SRAM Memory Cell

Figure 4A:
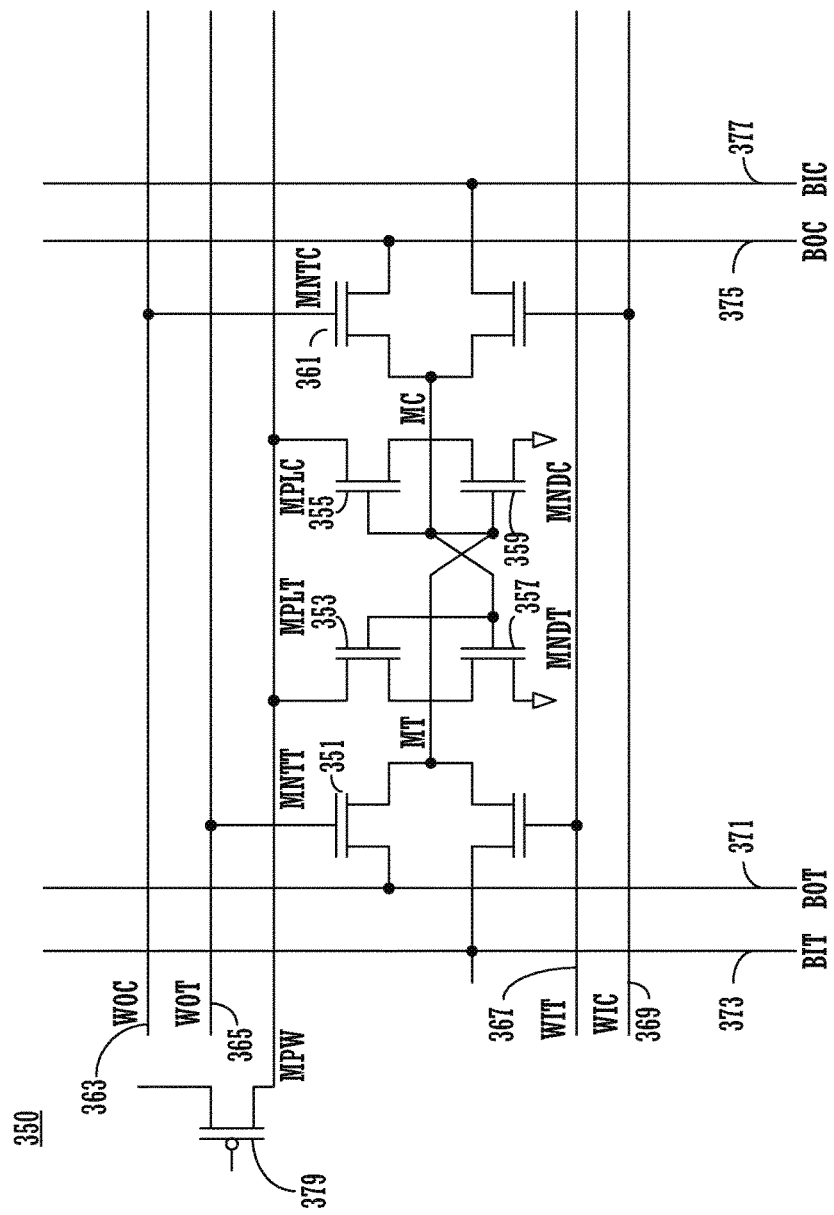
FIG. 4A shows SRAM memory cell that is configured for density/area maximization/minimization according to one embodiment.

FIG. 4A shows an SRAM memory cell 350 that is configured for density/area maximization according to one embodiment. FIG. 4A shows MNTT 351 (true side pass component), MPLT 353 (true side load transistor), MPLC 355 (complement side load transistor), MNDT 357 (true side drive transistor), MNDC 359 (complement side drive transistor), MNTC 361 (complement side pass transistor), W0C 363 (topside word line complement), W0t 365 (topside word line true), W1T 367 (bottom word line true), W1C 369 (bottom word line complement), B0T 371 (first true side bit line), B1T 373 (second true side bit line), B0c 375 (first complement side bit line) and B1C 377 (second complement side bit line) and MPW 379 (write margin assist/read stability assist transistor). Referring to FIG. 4A, transistors MPLT 353, MPLC 355, MNDT 357 and MNDC 359 constitute the data holding portion of SRAM memory cell 350. Transistors MNTT 351 and MNTC 361 are pass gates.

In one embodiment, as regards read operations, MPLT 353 and MPLC 355 are sized (increased with respect to prior art counterparts) to prevent a change of the cell state until transistor MPW 379 is deactivated. In addition, MPLT 353 and MPLC 355 are sized to allow activation of a single transfer gate WC or WT to allow single ended reads without cell instability. During write operations true/complement (differential write function) is allowed by activating both the W0C and W0t or W1C and W1T. Deactivating MPW 379 allows nodes MC, MT to become easier to transition by reducing the ability of MPLT 353, MPLC 355 to stop a write transition. Node PW can also be driven low to make more certain that MPLT 353, MPLC 355 present increasing impedances (not shown). The source node of MPLT 353 and MPLC 355 will move from Vdd toward Vss by virtue of a write current through MNTC 361 turning off MPLC 355 a delay time later. In one or more embodiments, MPW 379 can be external to memory cell 350 as is shown in FIG. 4A. In one or more other embodiments, MPW 379 can be internal to memory cell 350 to reduce capacitive effects. In one or more embodiments, memory cell(s) 350 can be used as a part of cache memory systems as shown in FIG. 4A. Moreover, in one or more embodiments, memory cell(s) 350 can be used to form CPU registers and/or register files of CPU execution units, whether or not memory cells 350 are used as a part of cache memory systems.

Operation

Figure 4B:
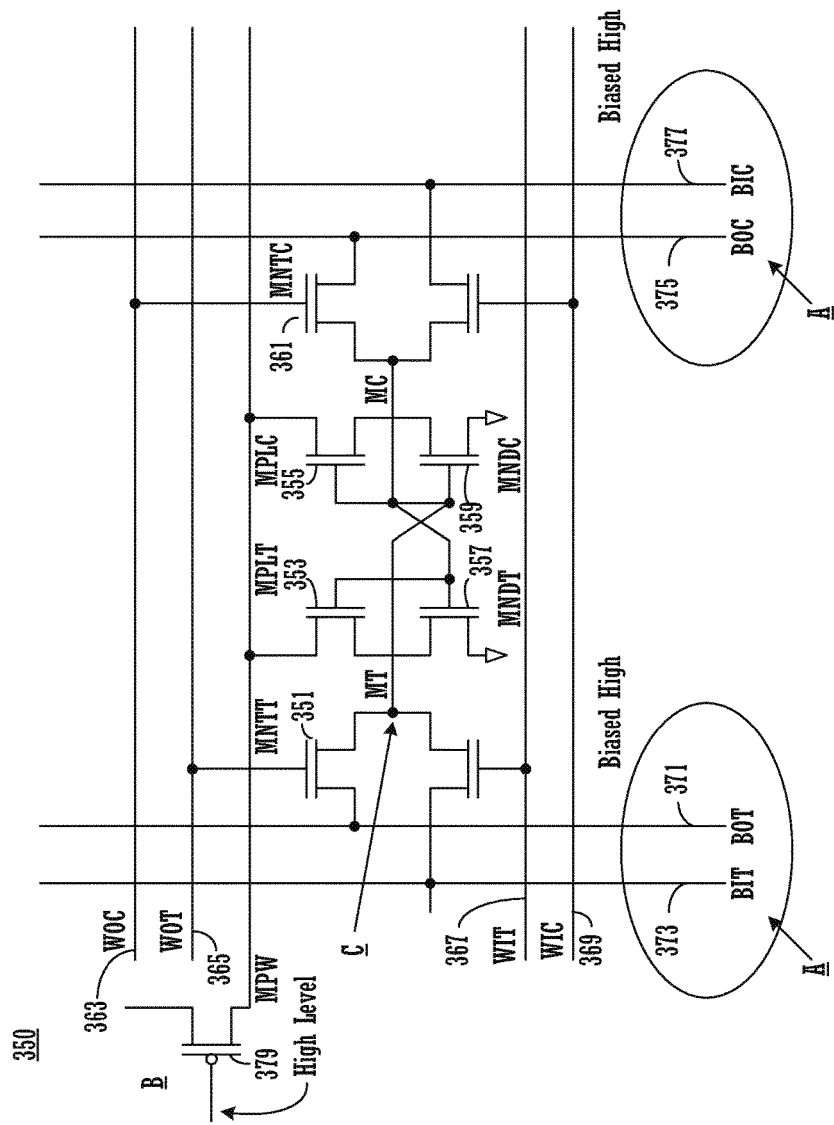
FIG. 4B illustrates a read operation of and SRAM memory cell that is configured for density/area maximization/minimization according to one embodiment.
Figure 4C:
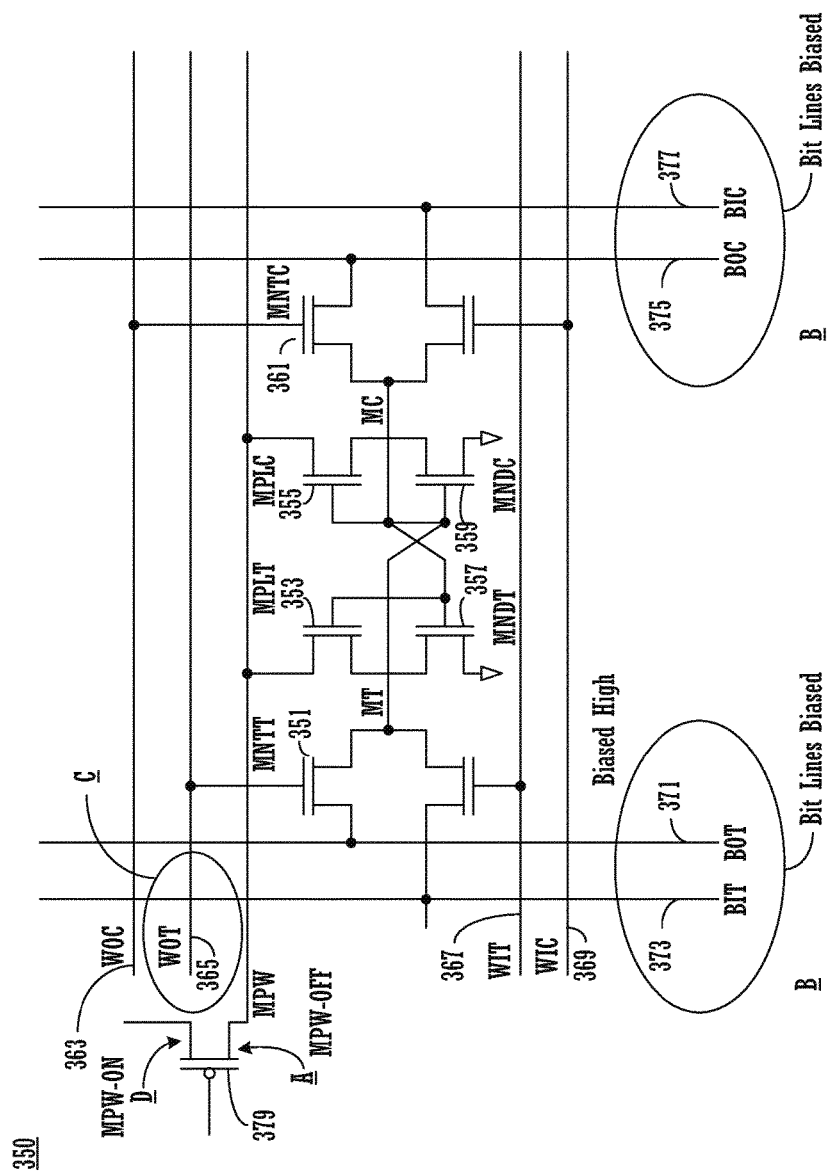
FIG. 4C illustrates a write operation of and SRAM memory cell that is configured for density/area maximization/minimization according to one embodiment.

FIGS. 4B and 4C illustrate read and write operations performed as a part of the operation of SRAM memory cell 350 that is configured for density/area maximization according to one embodiment. These operations, which relate to read and write operations, are illustrated for purposes of clarity and brevity. It should be appreciated that other operations not illustrated by FIGS. 4B and 4C can be performed in accordance with one embodiment.

Read Operation

Referring to FIG. 4B, at A, bit lines B1T 373, B0T 371, B1C 377 and B0C 375 are biased to a high level (for example the level of the supply voltage).

At B, a low level is placed onto the gate terminal of MPW 379. MPW 379 is turned on and is kept on for the duration of the read operation.

For a single ended read involving, for example, wordline W0T 365, W0T is driven high such that a high voltage is placed onto the gate terminal of pass gate MNTT 351. If pass gate MNTT 351 turns on, it provides an indication that node MT is low and that a low state is stored in memory cell 350. If the pass gate does not conduct, it provides an indication that node MT is high and that a high state is stored in the memory cell.

At C, the indication is provided to a peripheral circuit.

Write Operation

Referring to FIG. 4C, at A, MPW 379 is turned off. In one embodiment, MPW 379 can be turned off either before or after pass gate MNTT 351 is turned on (such that in the case where a low voltage level is being written into memory cell 350 read/write assist transistor MPW 379/MPLT 353 does not fight the impressing of the low voltage level therein).

At B, bit lines B1T 373, B0T 371, B1C 377 and B0C 375 are biased (to a low voltage level if the level to be written is low and to a high voltage level if the level to be written is high).

At C, for example, when a high voltage is to be written to the memory cell, a high voltage is placed onto the gate terminal of pass gate MNTT 351. For a single ended writes involving wordline W0T 365, W0T 365 is driven high such that the high voltage is placed onto the gate terminal of pass gate MNTT 351. If pass gate MNTT 351 turns on, it provides an indication that node MT is high and that a high state is stored in the memory cell no change of node state occurs. If pass gate MNTT 351 turns on, due to memory node MT in low state and bitline B0T in low state, no change of memory node MT occurs (both nodes at same voltage state). If bitline MT is initially high the conduction of MNTT 351 will drive node MT low. If pass gate MNTT 351 does not conduct bitline B0T is low, it provides an indication that node MT is low and that a low state is stored in the memory cell node MT (that a low state does not have to be changed). Because pass gate MNTT 351 does not conduct the stored state will not be changed. If pass gate MNTT 351 conducts and memory bitline node B0T is high, it indicates that node MT is low requiring transition to the high MT state. A beta ratioed condition will prevent write until node PW is lowered in voltage and MPLC 355 drives node MC to a lowered voltage condition to reduce the drive of MNDT 357 resulting in MNTT 351 driving node MT to vt threshold below positive supply and this state is further reinforced by MNDC driving node MT to negative supply.

At D, MPW 379 is turned on to ensure that the level that is written into the cell is maintained. Any intermediate voltage resulting from the write operation and pass transistor vt down states will be reinforced at this point in the operation.

Figure 5A:
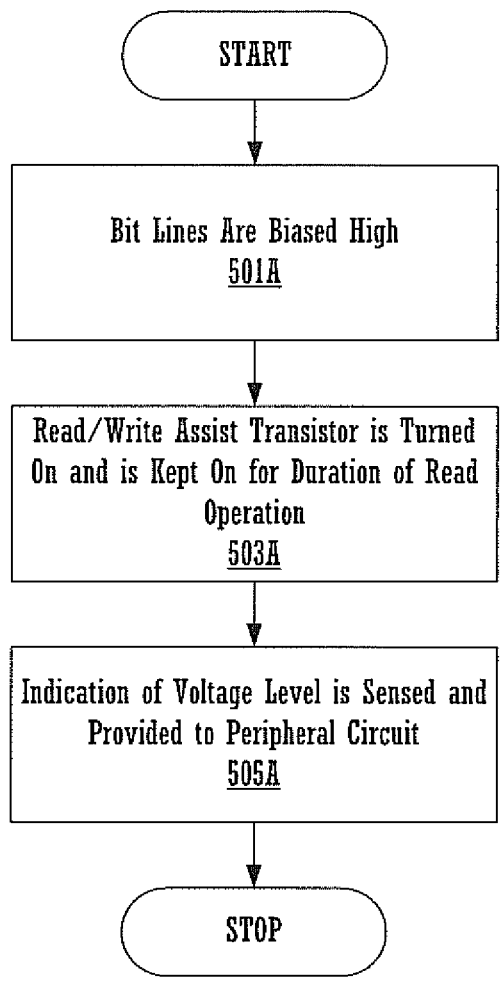
FIG. 5A shows a flowchart of the steps performed in a method for reading an SRAM memory cell according to one embodiment.
Figure 5B:
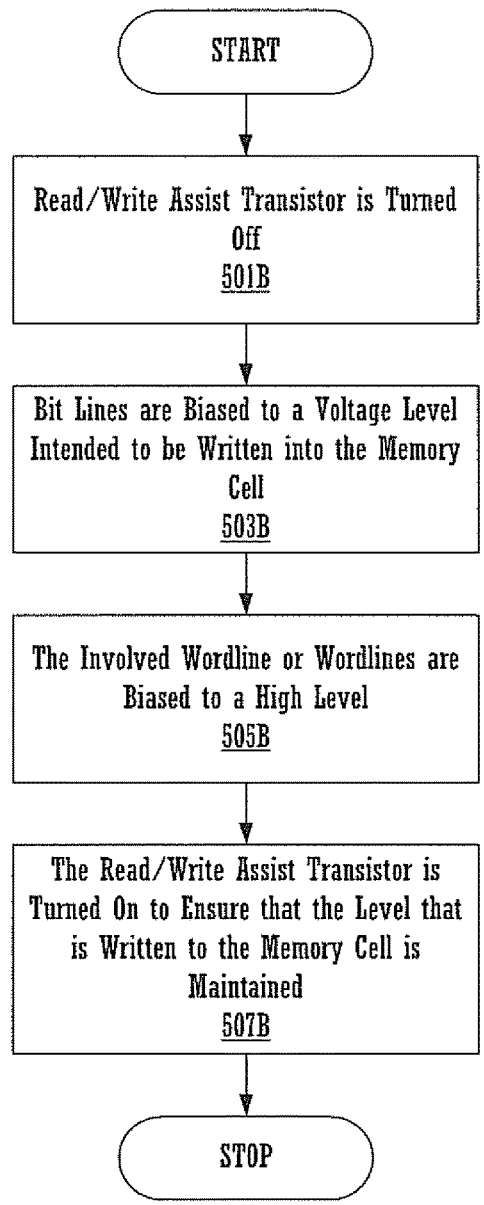
FIG. 5B shows a flowchart of the steps performed in methods for writing to an SRAM memory cell according to one embodiment.

Method for Operating an SRAM Memory Cell Configured for Density/Area Maximization/Minimization According to One Embodiment According to One Embodiment FIGS. 5A and 5B show flowcharts 500A and 500B of the steps performed in methods for reading and writing to an SRAM memory cell according to one embodiment. The flowchart includes processes that, in one embodiment can be carried out by processors and electrical components under the control of computer-readable and computer-executable instructions. Although specific steps are disclosed in the flowcharts, such steps are exemplary. That is the present embodiment is well suited to performing various other steps or variations of the steps recited in the flowchart. Although specific steps are disclosed in the flowcharts, such steps are exemplary. That is the present embodiments are well suited to performing various other steps or variations of the steps recited in the flowcharts.

Read Operation

Referring to FIG. 5A, at 501A, bit lines are biased to a high voltage level.

At 503A, read/write assist transistor is turned on and is kept on for the duration of the read of the read operation.

For a single ended read involving wordline W0T (e.g., 365 in FIG. 4A), W0T (e.g., 365 in FIG. 4A) is driven high such that a high voltage is placed onto the gate terminal of pass gate MNTT (e.g., 351 in FIG. 4A). If pass gate MNTT (e.g., 351 in FIG. 4A) turns on, it provides an indication that node MT is low and that a low state is stored in the memory cell. If the pass gate does not conduct, it provides an indication that node MT is high and that a high state is stored in the memory cell.

At 505A, the indication is sensed and provided to a peripheral circuit. It should be appreciated that reads involving other wordlines operate similarly.

Write Operation

Referring to FIG. 5B, at 501B, read/write assist transistor is turned off.

At 503B, bit lines are biased to a voltage level that is intended to be written into the memory cell. Alternately, the bitlines could be changed to the write state following wordline transition.

At 505B, for single ended writes the involved wordline is driven high such that a high voltage is placed onto the gate terminal of the pass gate that is involved in the write. If the pass gate turns on, it provides an indication that node MT is high and that a high state is stored in the memory cell. The conduction of the pass gate will cause the voltage that is stored in the memory cell to change. If the pass gate does not conduct, it provides an indication that state does not have to be changed. Moreover, because the pass gate is not caused to conduct the stored state will not be changed.

At 507B, the read/write assist transistor is turned on to ensure that the level that is written into the cell is driven to the high voltage level. In one or more embodiments, the wordline can be turned off following the turn on of the read/write assist transistor. In one or more other embodiments, the wordline can be turned off before the turn on of the read/write assist transistor. In one or more other embodiments, after 507B, if the memory node voltage state is different from the bitline voltage level, a memory cell node will change voltage states. This voltage level will be intermediate since the pass gate is not capable of driving to the high voltage state or node PW is at an intermediate state. In this case, read/write assist transistor can be turned on to drive the memory cell node from the intermediate state to the rail state.

A mutltiport memory cell having improved density area is disclosed. The memory cell includes a data storing component, a first memory access component coupled to a first side of the data storing component, a second memory access component coupled to a second side of the data storing component, first and second bit lines coupled to the first memory access component, first and second bit lines coupled to the second memory access component, first and second write lines coupled to the first memory access component and first and second write lines coupled to the second memory access component. The multiport memory cell also includes a read/write assist transistor, coupled to load transistors of the data storing component, that during read operations is activated for the duration of the read operation and during write operations to impress the desired voltage level is activated before or after one or more memory access components activated as a part of the write operation are deactivated. Although embodiments described herein and depicted in the accompanying Figures are discussed and shown as incorporating specific parts (transistor types etc.), the invention is not limited to such implementations, for example embodiments that utilize parts or part types other than those described herein but that provide the same functionality that is described herein can be implemented in accordance with the invention.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

I claim:

1. A memory cell, comprising:
   a data storing component;
   a first memory access component coupled to a first side of said data storing component;
   a second memory access component coupled to a second side of said data storing component;
   a plurality of lines coupled to said first memory access component and said second memory access component; and
   a read/write assist transistor, coupled to load transistors of said data storing component, wherein the read/write assist transistor during read operations is activated by a controller for the duration of the read operation and during write operations is activated by said controller to impress the desired voltage level before or after one or more memory access components activated as a part of the write operation are deactivated.

2. The memory cell of claim 1, wherein said plurality of lines comprise:
   first and second bit lines coupled to said first memory access component;
   first and second bit lines coupled to said second memory access component;
   first and second write lines coupled to said first memory access component; and
   first and second write lines coupled to said second memory access component.

3. The memory cell of claim 2, wherein said memory cell facilitates a differential write wherein either said first and second write lines coupled to said first memory access component or said first and second write lines coupled to said second memory access component are activated.

4. The memory cell of claim 2, wherein said memory cell facilitates a single ended write operation wherein a single write line and a single transistor of one of said first memory access component and said second memory access component is activated.

5. The memory cell of claim 1 wherein said memory cell comprises cross-coupled inverters.

6. The memory cell of claim 1 wherein said read/write assist transistor is coupled to terminals of load transistors of said memory cell.

7. The memory cell of claim 1 wherein said read/write assist transistor is located inside said memory cell.

8. The memory cell of claim 1 wherein said memory access components are coupled to respective internal nodes of said memory cell.

9. The memory cell of claim 1 wherein said memory cell comprises nodes that provide true and complement voltage levels.

10. A processor, comprising:
    a CPU;
    registers coupled to said CPU;

cache memory components coupled to said CPU wherein said registers and/or said cache memory components include memory cells, and wherein a memory cell comprises:
a data storing component;
a first memory access component coupled to a first side of said data storing component;
a second memory access component coupled to a second side of said data storing component;
a plurality of lines coupled to said first memory access component and said second memory access component; and
a read/write assist transistor, coupled to load transistors of said data storing component, wherein the read/write assist transistor during read operations is activated by a CPU for the duration of the read operation and during write operations is activated by said CPU to impress the desired voltage level before or after one or more memory access components activated as a part of the write operation are deactivated.

11. The processor of claim 10, wherein said plurality of lines of said memory cell comprises:
first and second bit lines coupled to said first memory access component;
first and second bit lines coupled to said second memory access component;
first and second write lines coupled to said first memory access component; and
first and second write lines coupled to said second memory access component.

12. The processor of claim 11 wherein said memory cell facilitates a differential write wherein either said first and second write lines coupled to said first memory access component of said first and second write lines coupled to said second memory access component are activated.

13. The processor of claim 11 wherein said memory cell facilitates a single
ended write operation wherein a single write line and a single transistor of one of said first memory access component and said second memory access component is activated.

14. The processor of claim 10 wherein said memory cell comprises cross-coupled inverters.

15. The processor of claim 10 wherein said read/write assist transistor is coupled to terminals of load transistors of said memory cell.

16. The memory cell of claim 10 wherein said read/write assist transistor is located inside said memory cell.

17. The processor of claim 10 wherein said memory access components are coupled to respective internal nodes of said memory cell.

18. The processor of claim 10 wherein said memory cell comprises nodes that provide true and complement voltage levels.

19. A method for accessing a memory cell, comprising:
in a mode comprising a read operation:
biasing one or more bit lines to a high voltage state;
turning a read/write assist component on;
placing a high voltage level onto the gate of a memory access component; and
determining if said memory access component is conducting, wherein said read/write assist transistor remains on for the duration of said read operation; and
in a mode comprising write operation:
biasing one or more bit lines to either a high or low voltage state;
placing a high voltage level onto the gate of a memory access component;
turning a read/write assist transistor on to impress the desired voltage level before or after said memory access component is turned off.

20. The method of claim 19 comprising executing a differential write wherein either first and second write lines coupled to a first memory access component or first and second write lines coupled to a second memory access component are activated.

21. The method of claim 19 comprising executing a single ended write operation wherein a single write line and a single transistor of one of a first memory access component and a second memory access component is activated.

22. The method of claim 19 wherein true and complement voltage levels
are provided.

23. A method for accessing a memory cell, comprising:
in a mode comprising a read operation:
biasing one or more bit lines to a high voltage state;
turning a read/write assist component on;
placing a high voltage level onto the gate of a memory access component; and
determining if said memory access component is conducting, wherein said read/write assist transistor remains on for the duration of said read operation.

* * * * *